(12) United States Patent  
Ikebuchi

(10) Patent No.: US 7,678,714 B2
(45) Date of Patent: Mar. 16, 2010

(54) METHOD FOR MANUFACTURING DYNAMIC RANDOM ACCESS MEMORY

(75) Inventor: Yoshinori Ikebuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/624,993

(22) Filed: Jan. 19, 2007

(65) Prior Publication Data

US 2008/0108183 A1    May 8, 2008

(30) Foreign Application Priority Data

Oct. 23, 2006    (JP)    ............................. 2006-287177

(51) Int. Cl.
*H01L 21/00*    (2006.01)

(52) U.S. Cl. ............... 438/795; 438/200; 257/E21.646; 257/E21.66

(58) Field of Classification Search ................ 438/200, 438/475, 477, 910; 257/296, E21.646
See application file for complete search history.

(56) References Cited

U.S. PATENT DOCUMENTS

| | | | | |
|---|---|---|---|---|
| 5,512,779 | A * | 4/1996 | Noda | .......................... 257/640 |
| 5,804,479 | A * | 9/1998 | Aoki et al. | .................... 438/253 |
| 5,866,946 | A * | 2/1999 | Kamigaki et al. | ........... 257/751 |
| 5,880,497 | A * | 3/1999 | Ikeda et al. | ................. 257/298 |
| 6,069,038 | A * | 5/2000 | Hashimoto et al. | .......... 438/241 |
| 6,337,514 | B1 * | 1/2002 | Ooishi | ........................ 257/751 |
| 6,476,444 | B1 | 11/2002 | Min | |
| 6,656,833 | B2 * | 12/2003 | Isogai | ......................... 438/629 |
| 2003/0087489 | A1 * | 5/2003 | Kuroda et al. | ............... 438/200 |
| 2005/0230779 | A1 * | 10/2005 | Ito | ............................. 257/499 |
| 2006/0284226 | A1 * | 12/2006 | Park et al. | ................... 257/296 |

FOREIGN PATENT DOCUMENTS

| | | |
|---|---|---|
| CN | 1677676 A | 10/2005 |
| JP | 05-129333 A | 5/1993 |
| JP | 11-135736 A | 5/1999 |
| JP | 2000-174030 A | 6/2000 |
| JP | 2001-044376 A | 2/2001 |
| JP | 2001-148471 A | 5/2001 |
| JP | 2002-261256 A | 9/2003 |
| JP | 2003-289131 A | 10/2003 |
| JP | 3583153 B2 | 10/2004 |
| JP | 2005-012100 A | 1/2005 |
| JP | 2005-217244 A | 8/2005 |

* cited by examiner

*Primary Examiner*—W. David Coleman
*Assistant Examiner*—Shaka Scarlett
(74) *Attorney, Agent, or Firm*—Sughrue Mion, PLLC

(57) ABSTRACT

The present invention has an object to provide a method for manufacturing a dynamic random access memory capable of reducing a defect rate even if the memory has a large packing density. The method of the present invention is a method for manufacturing a dynamic random access memory having memory array areas and a peripheral circuit area arranged in a semiconductor substrate and a silicon nitride film provided over the memory array areas and the peripheral circuit area, the method having at least a step (1) of eliminating the silicon nitride film provided in the peripheral circuit area; and a step (2) of processing in an atmosphere of a hydrogen gas a substrate-to-be-processed obtained by the step (1).

10 Claims, 15 Drawing Sheets

METHOD FOR MANUFACTURING DYNAMIC RANDOM ACCESS MEMORY

BACKGROUND OF THE INVENTION

1. Field of the Invention

The present invention relates to a method for manufacturing a dynamic random access memory, and more preferably, to a method for manufacturing a dynamic random access memory having a step of processing in an atmosphere of a hydrogen gas.

2. Related Art

Thin film polysilicon transistors (hereinafter referred to as "TFT" from the acronym of "thin film transistor") are often used in conventional semiconductor devices.

When such a TFT is used in a memory channel having a P channel MOS thin film polysilicon transistor stacked on N channel MOS field effect transistor, a semiconductor device on which the TFT is mounted spends too much standby current, which presents a problem.

This problem is known as caused by a trap level due to defects in polysilicon particle boundary or particles contained in the TFT.

As this trap level is formed by dangling bond contained in the polysilicon, decrease in the dangling bond effectively reduces the standby current. The dangling bond is terminated by hydrogen. In view of this, there has been proposed a method of terminating dangling bond contained in the polysilicon with use of hydrogen contained in plasma nitride film used in the polysilicon.

Specifically, in order to prevent diffusion of unnecessary OH groups inside the polysilicon when forming an oxide film in the TFT by wet reflow, a silicon nitride film is sometimes formed on the polysilicon as an OH group stopper.

Presence of this silicon nitride film prevents hydrogen contained in the plasma nitride film provided above the silicon nitride film from reaching a channel portion of the TFT formed of polysilicon below the silicon nitride film.

In order to solve this problem, there is proposed a method of manufacturing a semiconductor device having a step of forming a hole in the silicon nitride film (see Japanese patent application publication No. H5-129333).

There is proposed another method of manufacturing a semiconductor device including a step of radiating a semiconductor substrate, which has a semiconductor layer of polysilicon and the like and an insulating film formed on the semiconductor layer, with light for splitting a hydrogen gas into hydrogen atoms in an atmosphere where the hydrogen gas is contained (see Japanese patent application publication No. 2005-217244).

On the other hand, with recent advance of technology such as down sizing and weight reduction of electronic devices, a packing density per unit area of a dynamic random access memory tends to exhibit a significant increase. This increase of the packing density tends to increase a defect rate of the dynamic random access memory.

BRIEF SUMMARY OF THE INVENTION

According to the above-mentioned patent documents, the method of terminating dangling bond by use of hydrogen is effective for such a polysilicon as contained in the TFT.

However, the inventors have found that when a semiconductor substrate is used having single crystal silicon which contains dangling bond at a lower rate as compared with the case of polysilicon, simple processing of the semiconductor substrate with use of hydrogen is not enough to improve the defect rate through the processing of hydrogen.

The present invention has an object to provide a method for manufacturing a dynamic random access memory, capable of reducing a defect rate even if the packing density is increased.

The inventor of the present invention has studied intensively and completed the present invention by finding out that the object of the present invention can be achieved by a method of manufacturing a dynamic random access memory having memory array areas arranged on a semiconductor substrate and a peripheral circuit area arranged around each of the memory array areas on the semiconductor substrate by performing hydrogen processing on a substrate-to-be-processed obtained by eliminating a silicon nitride film provided on the peripheral circuit area.

More specifically, the present invention provides:

[1] a method for manufacturing a dynamic random access memory having a semiconductor substrate, memory array areas arranged in the semiconductor substrate, and a peripheral circuit area arranged around each of the memory array areas in the semiconductor substrate, the memory array areas each having a memory cell including an insulating film gate type electric field effect transistor, a cell contact and a capacitor, the peripheral circuit area having an insulating film gate type electric field effect transistor and a conducting circuit for controlling the memory cell, the memory array areas and the peripheral circuit area being provided with a silicon nitride film, the method comprising at least:

a step (1) of eliminating the silicon nitride film provided in the peripheral circuit area; and a step (2) of processing in an atmosphere of a hydrogen gas a substrate-to-be-processed obtained by the step (1).

Further, the present invention provides:

[2] a method for manufacturing a dynamic random access memory as described in the above item [1], in which the step (1) is eliminating a part or a whole of the silicon nitride film in the peripheral circuit area arranged around the memory array area and positioned outside the insulating film gate type electric field effect transistor out of the silicon nitride film provided over the memory array areas and the peripheral circuit area.

Furthermore, the present invention provides:

[3] a method for manufacturing a dynamic random access memory as described in the above item [1] or [2], in which each of the memory array areas is box-shaped and the memory array areas are arranged at given intervals to form, as a whole, one of box-shaped memory block areas in the semiconductor substrate, the box-shaped memory block areas are arranged at given intervals to form, as a whole, one box-shaped memory chip area in the semiconductor substrate, and the peripheral circuit area is arranged between two of the memory array areas and between two of the memory block areas, the step (1) including eliminating the silicon nitride film at the peripheral circuit area between the memory array areas.

Furthermore, the present invention provides:

[4] a method for manufacturing a dynamic random access memory as described in any one of the above items [1] to [3], further including a step (3) of eliminating the silicon nitride film provided at the memory array areas.

Furthermore, the present invention provides:

[5] a method for manufacturing a dynamic random access memory as described in any one of the above items [1] to

[4], in which the insulating film gate type electric field effect transistor included in the memory cell has a recess structure.

Furthermore, the present invention provides:

[6] a method for manufacturing a dynamic random access memory as described in any one of the above items [1] to [5], in which the processing in the atmosphere of the hydrogen gas of the step (2) is performed at temperatures of from 380 to 470° C., inclusive, and for a time duration of from one-half hour to twelve hours.

Furthermore, the present invention provides:

[7] a method for manufacturing a dynamic random access memory as described in any one of the above items [1] to [6], further including a step (4) of lowering a temperature to 300° C. or less.

Furthermore, the present invention provides:

[8] a dynamic random access memory obtained by the method as described in any one of the above items [1] to [7].

Furthermore, the present invention provides:

[9] an electronic device equipped with the dynamic random access memory of the above item [8].

According to the present invention, it is possible to provide a method for manufacturing a dynamic random access memory capable of reducing the defect rate even with a larger packing density.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

The present invention provides a method for manufacturing a dynamic random access memory (hereinafter referred to as "DRAM"). First description is made, with reference to the drawings, about a configuration of the DRAM obtained by this method.

Figure 1:
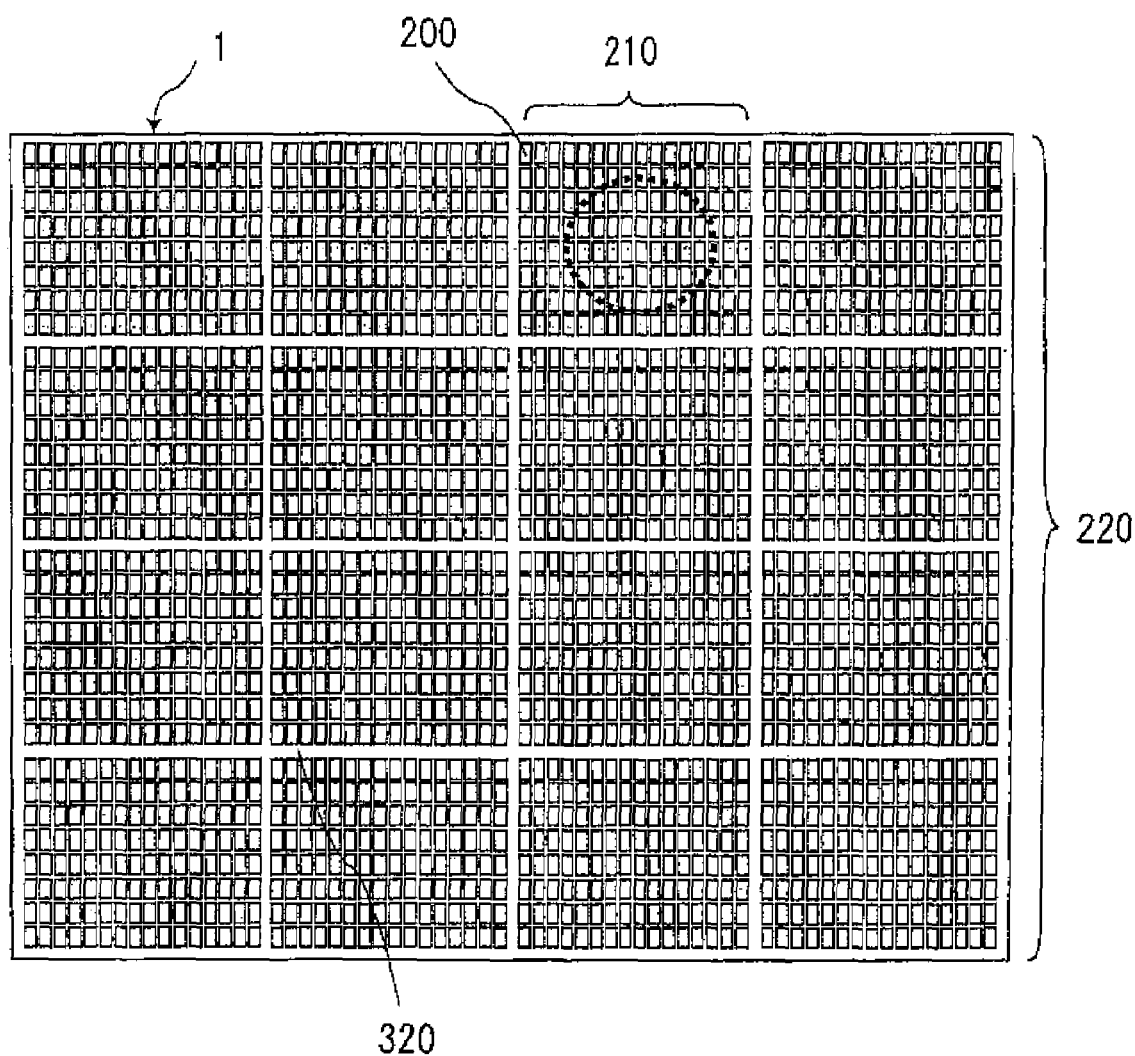
FIG. 1 is a plan view schematically illustrating an overview of a DRAM chip observed in the direction of the normal to the surface of a semiconductor substrate.
Figure 2:
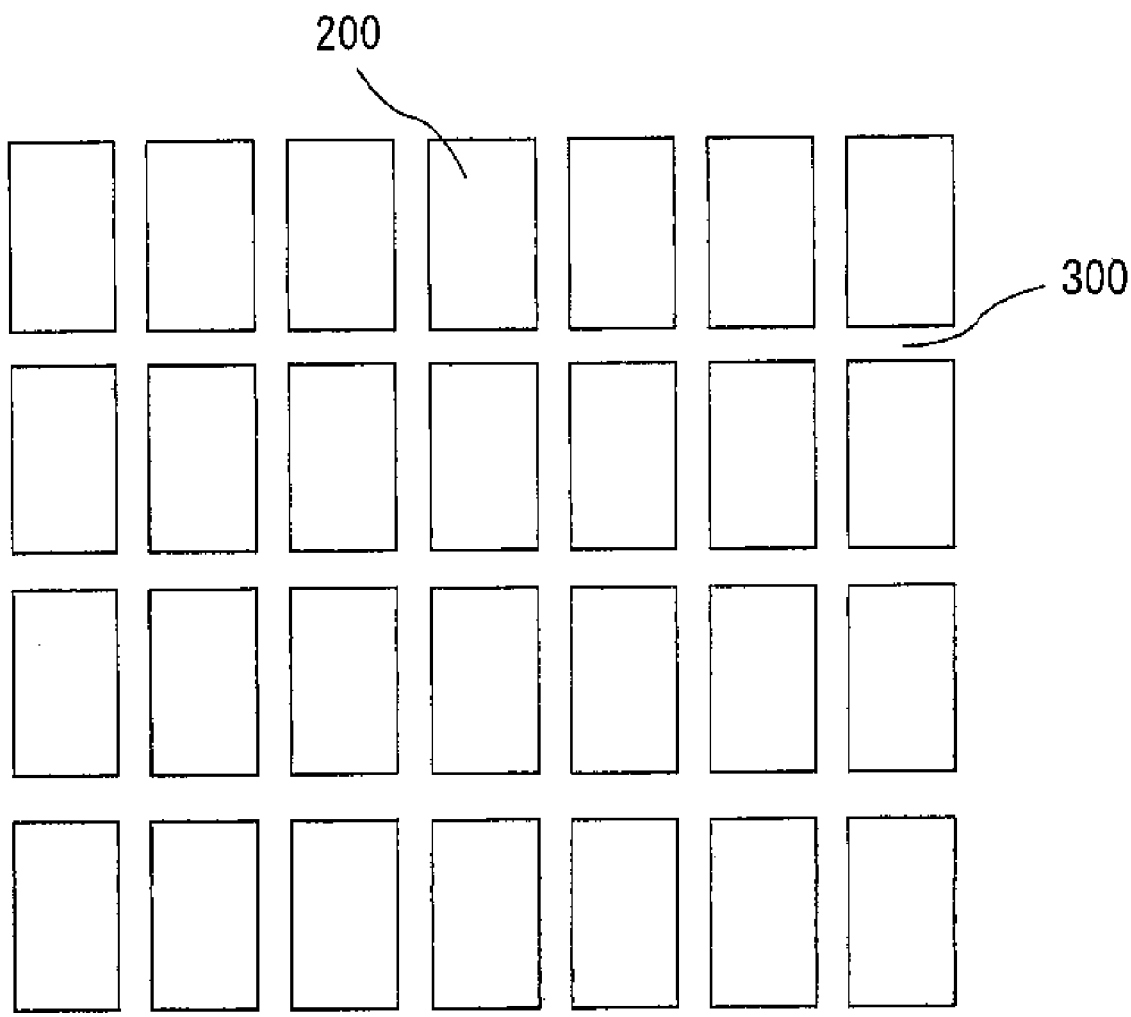
FIG. 2 is a magnified plan view of a portion circled by the dotted line in FIG. 1.

FIG. 1 is a plan view schematically illustrating an overview of a chip of the DRAM observed in the direction of the normal to the surface of the semiconductor substrate, and FIG. 2 is a magnified plan view of a portion circled by the dotted line in FIG. 1.

As illustrated in FIG. 2, the semiconductor substrate 1 has memory array areas 200 arranged thereon and a peripheral circuit area 300 around the memory array areas 200.

Here, the semiconductor substrate 1 used in the present invention is for example a semiconductor silicon substrate. There is no particular limitation on the semiconductor substrate 1 used in the present invention and any commercially available semiconductor substrate may be used depending on the purpose.

Figure 3:
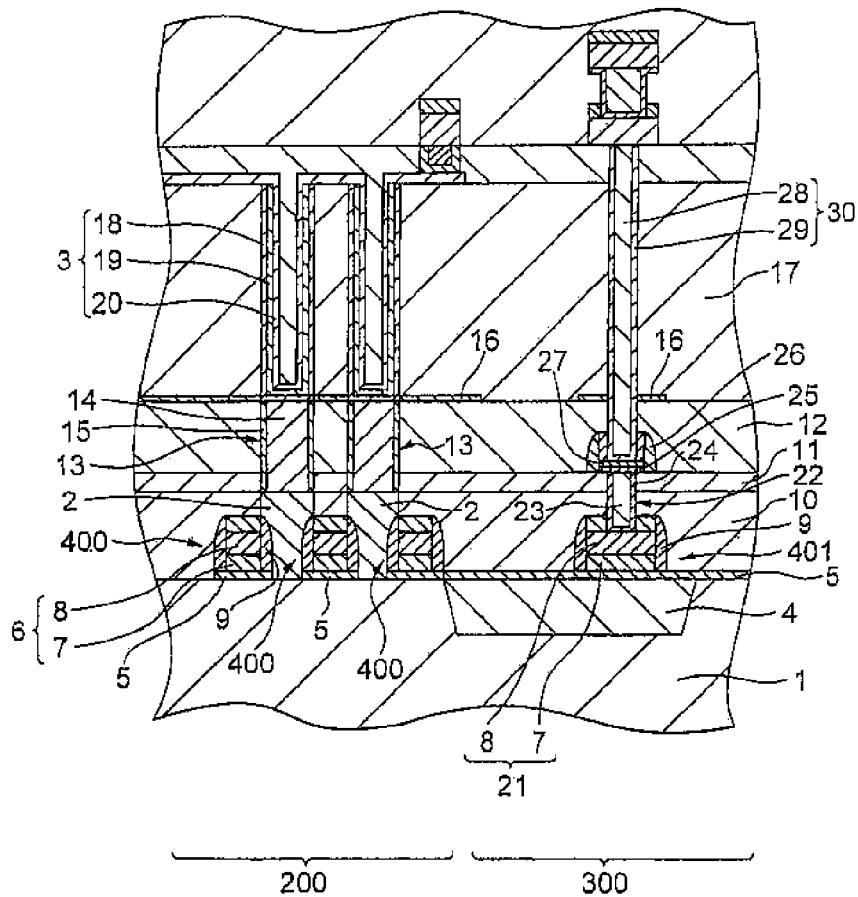
FIG. 3 is a substantial-part cross sectional view for explaining a manufacturing process of the present invention, the view illustrating a cross section of the semiconductor substrate cut in the vertical direction 1.

FIG. 3 is a substantial-part cross sectional view for explaining a manufacturing method of the present invention, the view illustrating a cross section taken in the vertical direction of the semiconductor substrate 1 relative to the surface of the semiconductor substrate 1.

In FIG. 3, the reference numeral 200 indicates a substantial part of one of the memory array areas 200 and the reference numeral 300 indicates a substantial part of the peripheral circuit area 300.

The memory array area 200 is formed, as illustrated in FIG. 3, of an assembly of memory cells including insulating film gate type electric field effect transistors 400, cell contacts 2 and capacitors 3.

The memory array area 200 is described further in detail. A device separation insulating film 4 is provided in the semiconductor substrate 1 to define a cell area corresponding to each memory cell. An impurity is introduced into the semiconductor substrate 1 defined by this device separation insulating film 4 and thereby source and drain regions are formed (not shown).

In addition, formed on the semiconductor substrate 1 are gate electrodes 6 corresponding to the source and drain regions via respective gate oxide films 5 of silicon oxide or the like. Each of these gate electrodes 6 includes a polysilicon 7 containing an N-type impurity of phosphorus or the like and a P-type impurity of boron or the like, a conductive layer 8 of tungsten, tungsten silicide or the like formed on the polysilicon, and the like.

The insulating film gate type electric field effect transistors 400 are thus formed in the semiconductor substrate 1 and serve as transistors for memory cells.

Further, cell contacts 2 are formed electrically connected to the drain region (not shown) formed in the semiconductor substrate 1.

Each of the cell contacts 2 is made of polysilicon containing an N-type impurity of phosphorus or the like and a P-type impurity of boron or the like. The cell contacts 2 are isolated by an interlayer insulating film 10 and side walls 9 of silicon nitride or the like formed at both sides of each gate electrode 6.

Further, formed on the upper side of each cell contact 2 is a capacity contact 13 electrically connected to the cell contact 2.

The capacity contact 13 is formed of a polysilicon 14 containing an N-type impurity of phosphorous or the like and a P-type impurity of boron or the like and side walls 15 of titanium nitride or the like, and the capacity contact 13 is insolated by interlayer insulating films 11 and 12.

Formed on the upper side of the capacity contacts 13 and the interlayer insulating film 12 is an interlayer insulating film 17 via a silicon nitride film 16.

Formed on each of the capacitor contacts 13 is a capacitor 3 electrically connected to the capacitor contact 13. The capacitor 3 has a lower electrode 18 of titanium nitride or the like, a capacitor film 19 of silicon oxide, aluminum oxide, hafnium oxide or the like and an upper electrode 20 of titanium nitride or the like.

On the other hand, the peripheral circuit area 300 has an insulating film gate type electric field effect transistor 401 and a conducting circuit for controlling the memory cells. A plurality of such insulating film gate type electric field effect transistors 401 and conducting circuits is formed in the semiconductor substrate 1 to control the memory cells.

This peripheral circuit area 300 is used to perform input/output of data of the memory cells, memory control and the like.

Source and drain regions (not shown) and a gate electrode 21 for controlling the memory cells are formed in the semiconductor substrate 1, and the source and drain regions and the gate electrode 21 constitute the insulating film gate type electric field effect transistor 401.

This gate electrode 21 has a polysilicon 7 containing an N-type impurity of phosphorus or the like and a P-type impurity of boron or the like, a conductive layer 8 of tungsten, tungsten silicide or the like formed on the polysilicon, and the like.

Besides, there is a bit contact 22 formed electrically connected to the gate electrode 21.

The bit contact 22 is made of polysilicon 23 containing an N-type impurity of phosphorus or the like and a P-type impurity of boron or the like and sidewalls 24 of titanium nitride or the like. The bit contact 22 is isolated by the interlayer insulating films 10 and 11.

In addition, there is a bit line 25 formed of W or the like electrically connected to the bit contact and the bit line 25 is sandwiched by bit line side walls 26 of silicon nitride or the like.

The bit line 25 is isolated by an interlayer insulating film 12.

Besides, formed on the bit line 25, via a silicide layer 27 of titanium silicide or the like, is a contact plug 30 as one conducting circuit, and the contact plug 30 is electrically connected to the bit line 25.

The contact plug 30 is made of a polysilicon 28 containing an N-type impurity of phosphorus or the like and a P-type impurity of boron or the like and sidewalls 29 of titanium nitride or the like, and the contact plug 30 is isolated by the interlayer insulating films 12 and 17.

Here, formed on the capacitors 3 in the memory array area 200 and the contact plug 30 is a conducting circuit in an interlayer insulating film of silicon oxide.

Figure 4:
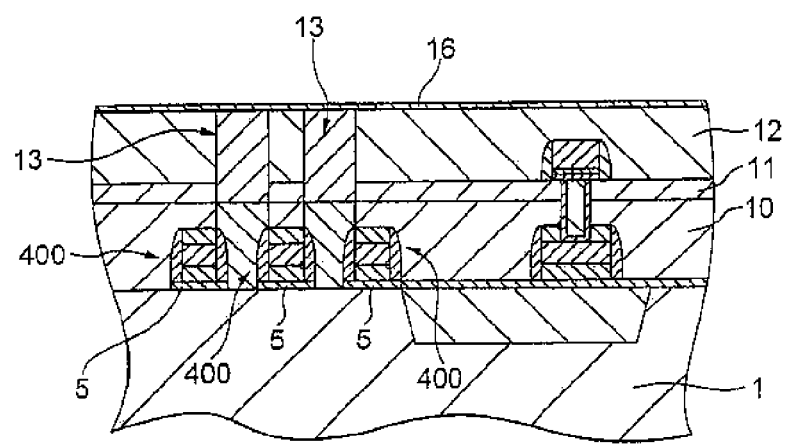
FIG. 4 is a substantial-part cross sectional view for explaining a step of forming a silicon nitride film on the upper surfaces of the capacitor contacts and the interlayer insulating film.

FIG. 4 is a substantial-part cross sectional view for explaining a step of forming a silicon nitride film 16 on the upper surfaces of the capacitor contacts 13 and the interlayer insulating film 12.

This silicon nitride film 16 is formed as a layer for preventing excess etching when a cylinder hole is opened in the interlayer insulating film by etching in manufacturing of a cylinder type capacitor.

First, the upper surfaces of the capacitor contacts 13 and the interlayer insulating film 12 are flattened by CMP (Chemical Mechanical Polish) or the like, and then, ammonia and dichlorosilane are made to react at temperatures ranging from 600 to 650° C. thereby to form the silicon nitride film 16 of 30 to 70 nm, or preferably of 40 to 60 nm, in thickness.

Here, the position where this silicon nitride film 16 is formed is preferably on the upper surfaces of the capacitor contacts 13 and the interlayer insulating film 12, however, the silicon nitride film 16 may be formed at any position above the gate oxide film formed in the memory array area 200.

In addition, the silicon nitride film 16 is preferably formed at a position lower than the upper surfaces of the capacitors, or more preferably formed in contact with the upper surfaces of the capacitor contacts.

Figure 5:
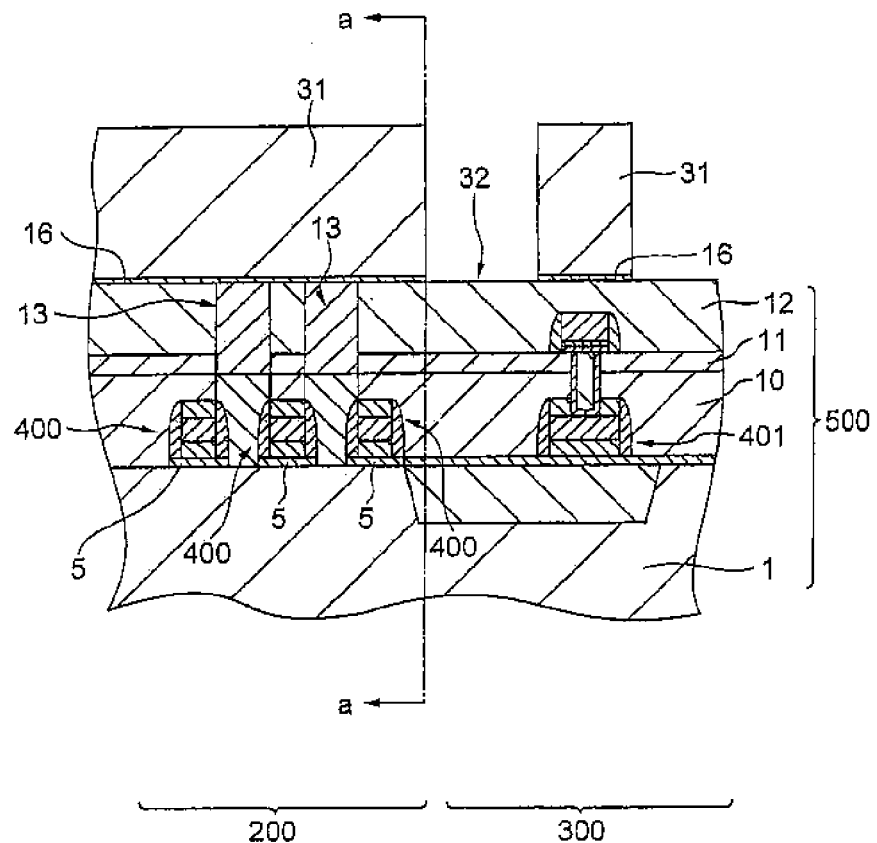
FIG. 5 is a substantial-part cross sectional view for explaining a step of eliminating the silicon nitride film.

FIG. 5 is a substantial-part cross sectional view for explaining a step of eliminating the silicon nitride film 16, and illustrates the step of eliminating the silicon nitride film 16 according to a first embodiment.

First, a photoresist layer 31 is formed on the silicon nitride film 16, and a resist pattern for eliminating the silicon nitride film 16 is formed by well-known lithography.

This resist pattern is used as a mask to form by selective etching an opening 32 for introducing hydrogen into the boundary between the gate oxide film 5 and the semiconductor substrate 1 where the insulating film gate type electric field effect transistors 400 are formed in the memory array area 200, which is illustrated in FIG. 5.

The selective etching is, for example, reactive ion etching.

The reactive ion etching is performed at pressures ranging from 1 to 1000 mTorr, preferably from 10 to 500 mTorr, more preferably, from 50 to 300 mTorr, in the presence of halogenated hydrocarbon, oxygen, argon or the like.

The reactive ion etching is performed at temperatures ranging from 10 to 200° C., or preferably from 20 to 100° C.

According to this first embodiment, the silicon nitride film 16 is eliminated in the peripheral circuit area 300 arranged around the memory array area 200 and positioned outside the insulating film gate type electric field effect transistors 400.

Here, the memory array area 200 means an area inside the memory cell located at the outer edge of the memory array area 200, and the area is on the left side of the dash-dotted line in FIG. 5.

The peripheral circuit area 300 means an area on the right side of the dash-dotted line in FIG. 5.

Elimination of the silicon nitride film 16 is not limited to the above-described first embodiment, and can be performed in accordance with the following second to fourth embodiments.

For example, elimination of the silicon nitride film 16 according to the second embodiment is described below.

Figure 6:
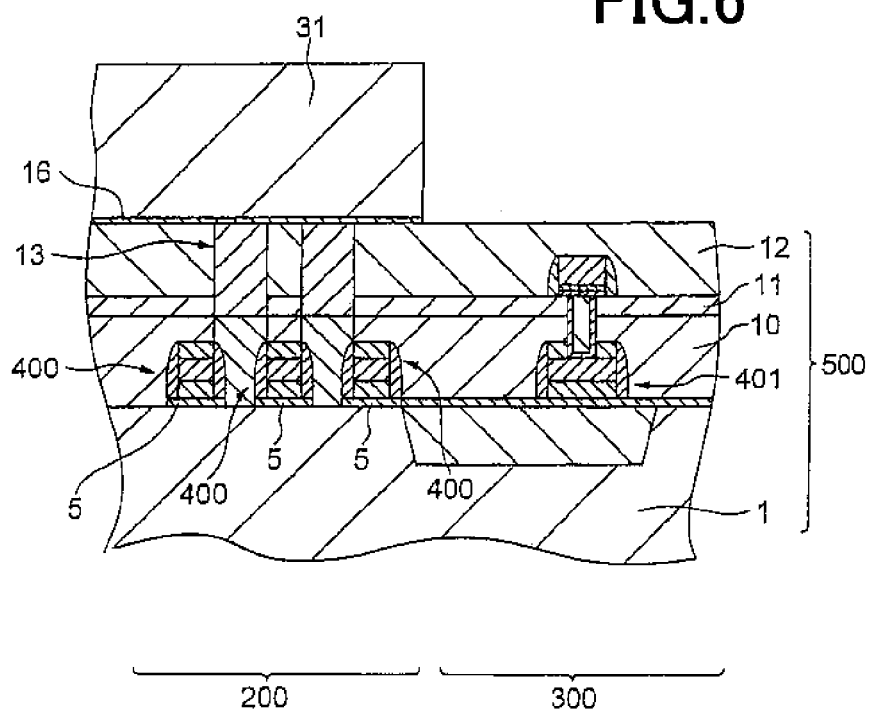
FIG. 6 is a substantial-part cross sectional view explaining a step of eliminating the silicon nitride film.

FIG. 6 is a substantial-part cross sectional view explaining the step of eliminating the silicon nitride film 16.

According to the above-described first embodiment, the silicon nitride film 16 remains in the peripheral circuit area 300 by a part corresponding to the width of the insulating film gate type electric field effect transistor 401. On the other hand, according to the second embodiment, as illustrated in FIG. 6, the silicon nitride film 16 in the peripheral circuit area 300 is eliminated entirely.

Next, elimination of the silicon nitride film 16 according to the third embodiment is described.

Figure 7:
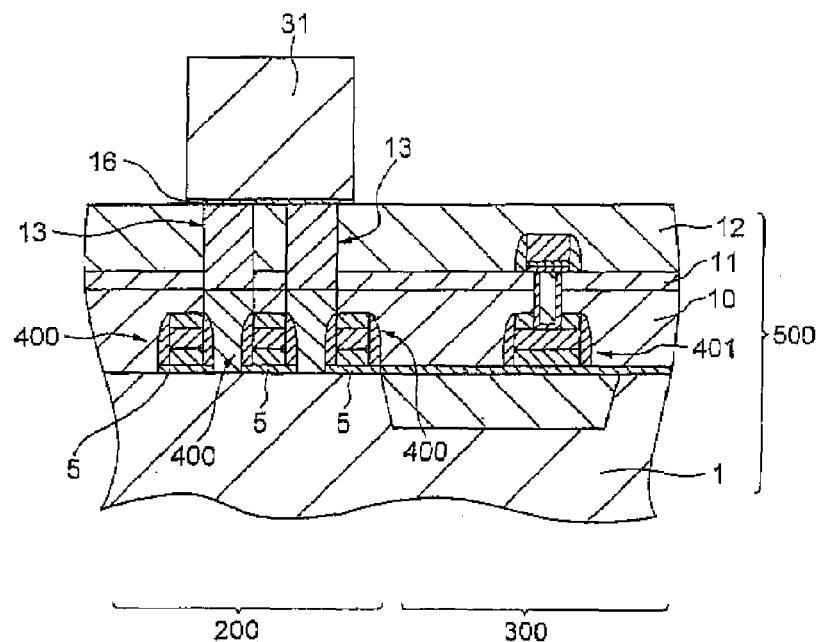
FIG. 7 is a substantial-part cross sectional view explaining a step of eliminating the silicon nitride film.

FIG. 7 is a substantial-part cross sectional view explaining the step of eliminating the silicon nitride film 16.

As illustrated in FIG. 7, in addition to the silicon nitride film 16 provided in the peripheral circuit area 300, the silicon nitride film 16 provided in the memory array area 200 can be also eliminated.

According to the third embodiment, the silicon nitride film 16 remains in the vicinity of and on the upper surfaces of the capacitor contacts 13.

After eliminating the silicon nitride film 16, the photoresist layer 31 is eliminated by ashing. This also applies to the embodiment described later.

Next description is made about the fourth embodiment as a modification of the third embodiment.

Figure 8:
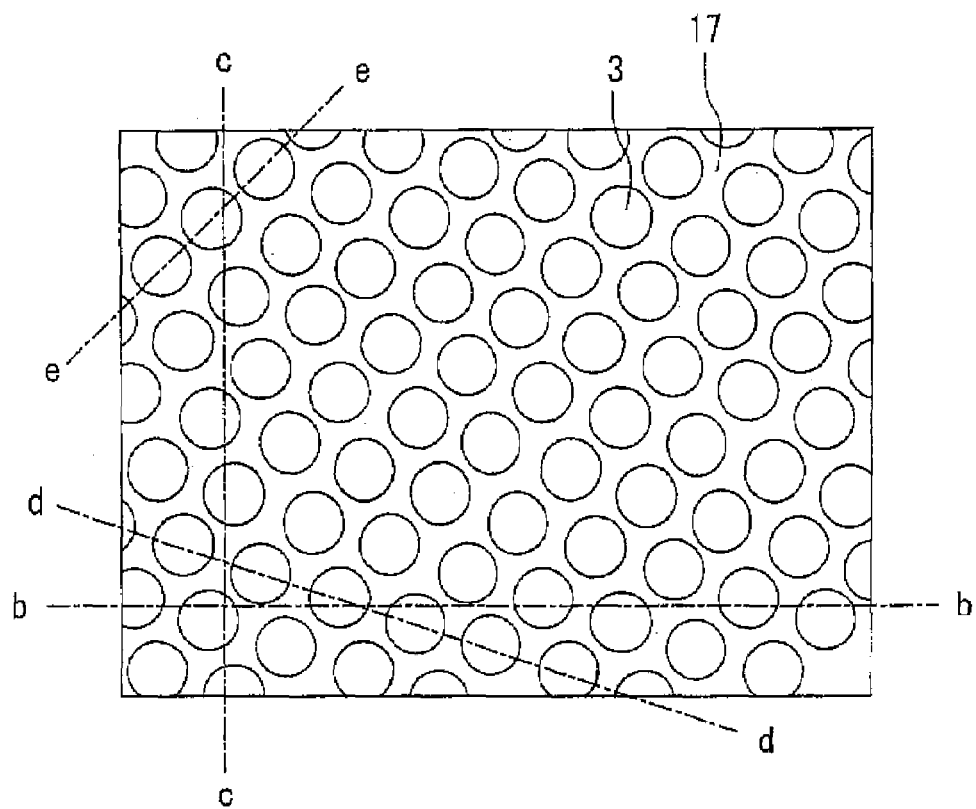
FIG. 8 is a substantial-part cross sectional view of the capacitors provided in the memory array area 200, the capacitors being cut at a plane parallel to the semiconductor substrate 1 and the cut surface being seen from the upper side.

FIG. 8 is a substantial-part cross sectional view of the capacitors 3 provided in the memory array area 200 in FIG. 3, the capacitors 3 being cut at a plane parallel to the semiconductor substrate 1 and the cut surface being seen from the upper side.

Each circle shown in FIG. 8 shows a section of each of the capacitors 3.

As illustrated in FIG. 8, each capacitor is arranged so as to be surrounded by six equally spaced capacitors.

Here, the dash-dotted line b-b represents a direction in which DRAM bit lines are arranged while the dash-dotted line c-c represents a direction in which DRAM word lines are arranged.

The capacitors are, as represented by the dash-dotted line d-d, arranged in a direction of 18° relative to the direction of the bit lines. The capacitors are, as represented by the dash-dotted line e-e, arranged in a direction of 45° relative to the direction of the word lines.

Here, arrangement of the capacitors in FIG. 8 is given by way of example and is not for limiting the present invention.

Figure 9:
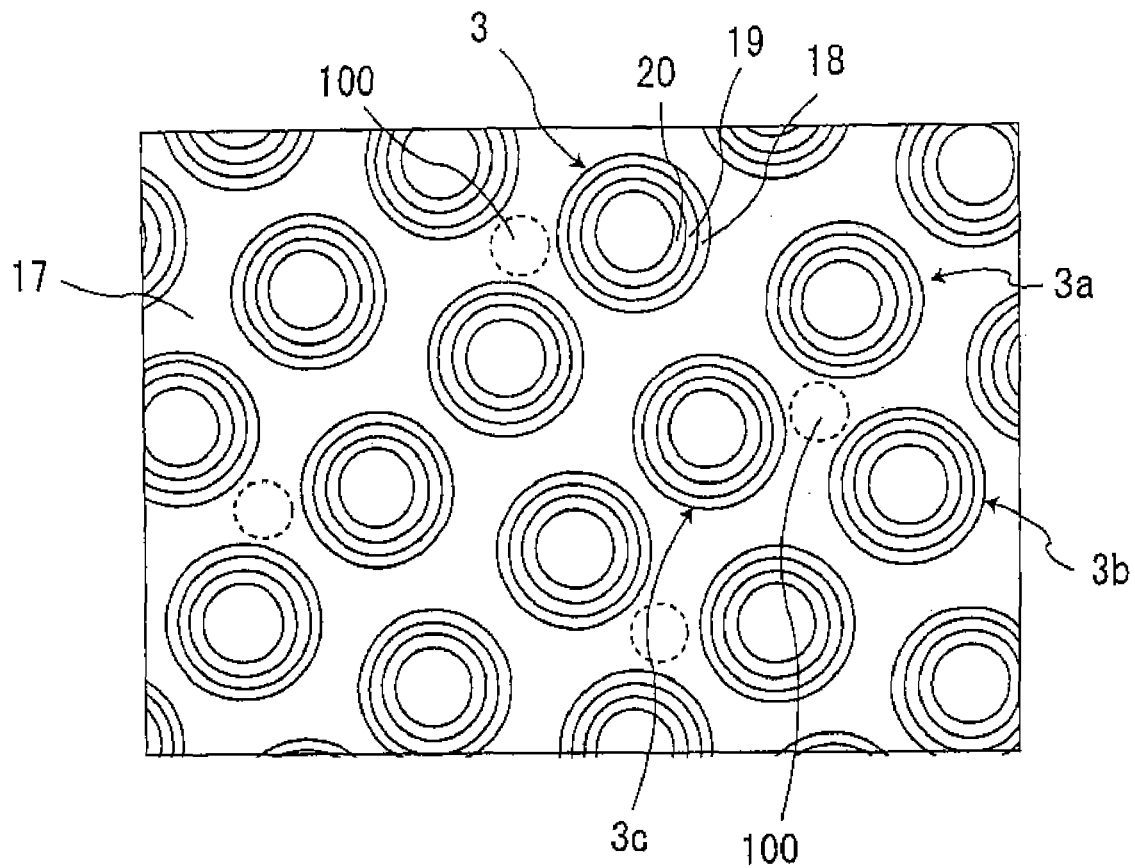
FIG. 9 is a substantial-part cross sectional view illustrating a part of FIG. 8 enlarged.

FIG. 9 is a substantial-part cross sectional view illustrating a part of FIG. 8 enlarged.

As illustrated in FIG. 9, each of the capacitors 3 consists of a lower electrode 18, a capacitor film 19, an upper electrode 20, and the like.

The reference numeral 100 indicates a position where the silicon nitride film 16 is partially eliminated in the memory array area 200 described in the third embodiment with reference to FIG. 7.

As indicated by the reference numeral 100 of FIG. 9, there are plural eliminated parts of the silicon nitride film 16, each of which is surrounded by three capacitors, for example, by three capacitors 3a, 3b and 3c.

Figure 10:
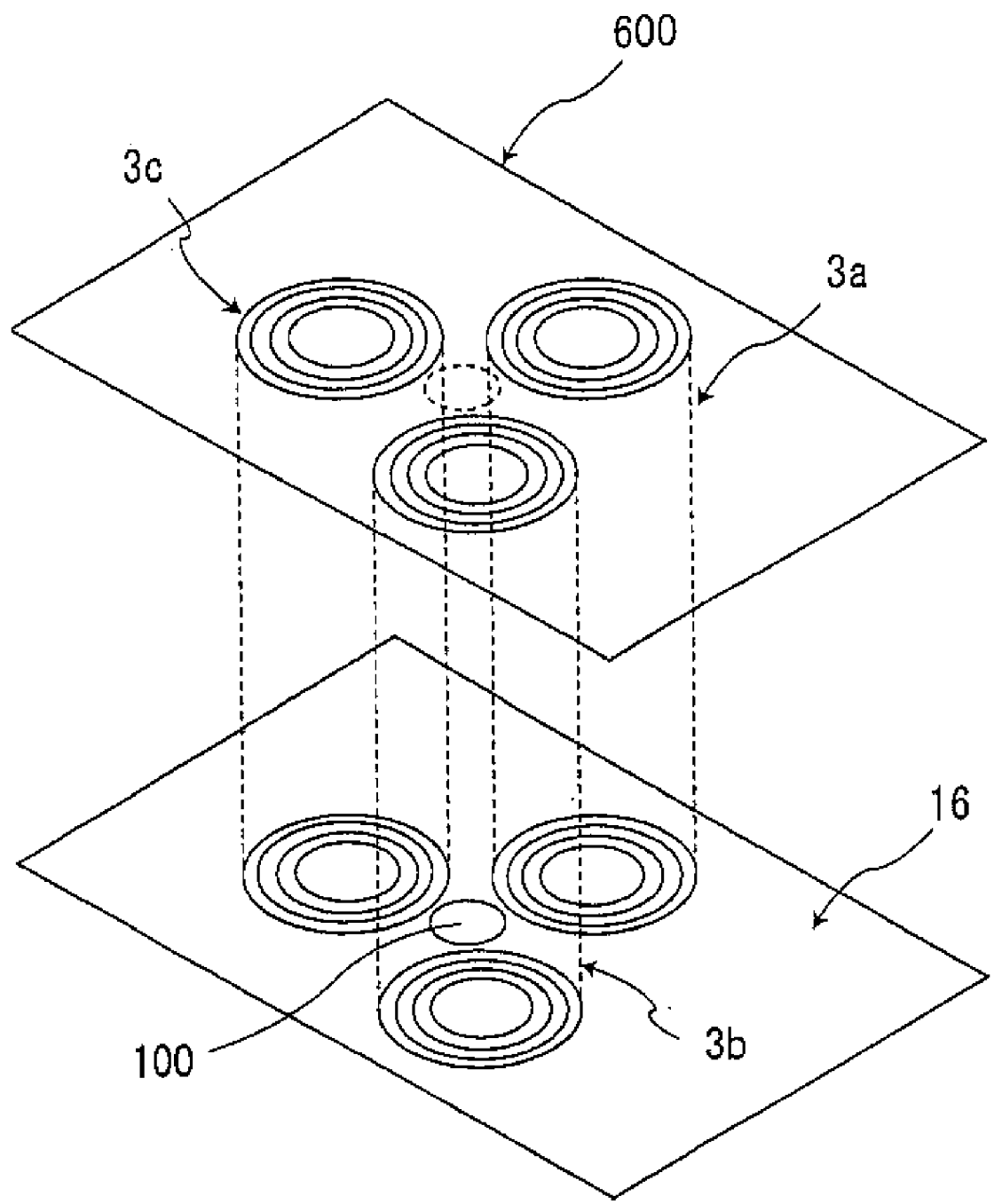
FIG. 10 is a substantial-part perspective view for explaining where to eliminate the silicon nitride film.

FIG. 10 is a substantial-part perspective view illustrating the capacitors 3a, 3b and 3c of FIG. 9 enlarged.

In FIG. 10, the main body of each of the capacitors 3 (3a, 3b and 3c) are represented by dotted lines. Besides, the silicon nitride film 16 is provided at the same plane as that of the bottom of the capacitors 3. The reference numeral 600 represents the cut surface in FIG. 9.

In the previous figure of FIG. 9, when an image of a portion indicated by the reference numeral 100 is projected onto the silicon nitride film 16 in the direction of the normal to the semiconductor substrate surface, the image appears on the silicon nitride film 16. This is represented by the reference numeral 100 in FIG. 10.

Actually, the silicon nitride film 16 positioned corresponding to the reference numeral 100 in FIG. 10 is eliminated.

Assume that when the silicon nitride film 16 is eliminated at all the positions surrounded by three capacitors, the elimination rate is performed at 100%. Then, the elimination rate of the silicon nitride film in the memory array area is preferably 5 to 90%, or more preferably 10 to 30%.

When the diameter of each capacitor is 200 nm, the diameter of the portion indicated by the reference numeral 100 is generally in the range of from 50 to 120 nm.

As the silicon nitride film in the memory array area is partially eliminated in this way, it becomes possible to supply hydrogen into the memory array area smoothly.

Next description is made about a step of processing the substrate-to-be-processed in an atmosphere of a hydrogen gas after eliminating of the silicon nitride film 16. The following description is made based on the above-described first embodiment, however, the same can be adopted in the second to fourth embodiments.

The above-described substrate-to-be-processed 500, which is subjected to eliminating of the silicon nitride film 16 as illustrated in FIG. 5, is processed in an atmosphere of a hydrogen gas in an apparatus for hydrogen treatment (not shown), at temperatures of 380 to 470° C., preferably of 390 to 450° C. or more preferably of 400 to 410° C. and for one minute to twenty-four hours, preferably thirty minutes to ten hours or more preferably one hour to eight hours.

Here, the hydrogen treatment is conducted after eliminating of the photoresist layer 31 by ashing or the like.

In addition, in using of the hydrogen gas, in order to prevent explosion from being caused, it is preferable that the apparatus is filled with an inert gas of nitrogen gas, argon gas or the like sufficiently and then a hydrogen gas is introduced into the inside of the apparatus.

This step of hydrogen treatment is usually conducted while making the hydrogen gas flow into the apparatus. Here, the step may be performed while only the hydrogen gas is made to flow into the apparatus or while the hydrogen gas and an inert gas of nitrogen gas, argon gas or the like are made to flow into the apparatus.

In completion of this step, the temperature of the substrate-to-be-processed 500 is lowered at 300° C. or less before introduction of the hydrogen gas into the apparatus is stopped and the gas inside the apparatus is preferably replaced with the inert gas.

As in this processing, hydrogen is introduced into the boundary between the gate oxide film 5 and the semiconductor substrate 1 where the insulating film gate type electric field effect transistors 400 are formed in the memory array areas 200, it is possible to terminate dangling bond existing at the boundary between the gate oxide film 5 and the semiconductor substrate 1 corresponding to the insulating film gate type electric field effect transistors 400.

This enables to prevent leak current caused by the dangling bond from occurring thereby improving the refresh performance of an obtained DRAM.

Figure 11:
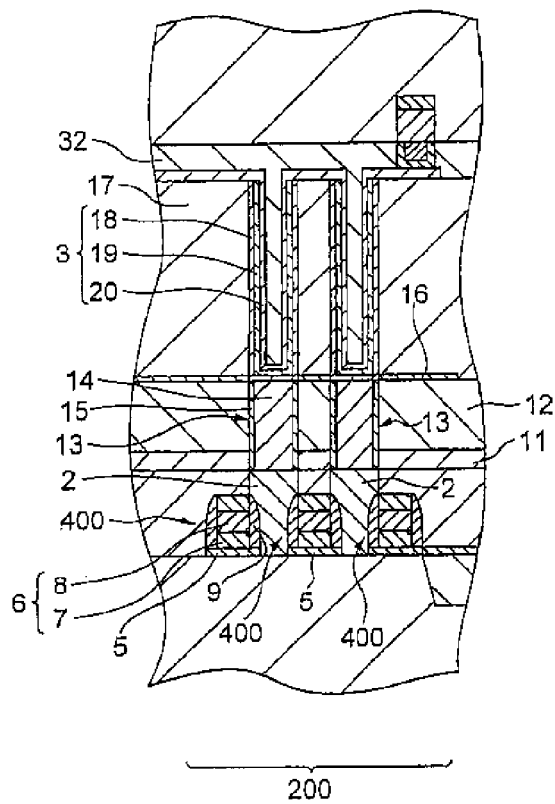
FIG. 11 is a substantial-part cross sectional view for explaining a step of forming capacitors in the memory array area of the substrate-to-be processed.

FIG. 11 is a substantial-part cross sectional view for explaining a step of forming capacitors in the memory array area 200 of the substrate-to-be processed.

As illustrated in FIG. 11, formed on the interlayer insulating film 12 and the silicon nitride film 16 is an interlayer insulating film 17 of BPSG (boron phosphorous silicate glass) by thermal CVD using TEOS (tetraetoxysilane), silicon oxide by plasma method or the like.

Next, formed on the interlayer insulating film 17 is a photoresist layer, and then, a resist pattern (not shown) is formed on interlayer insulating film 17 by well-known lithography so as to form a cylinder hole.

This resist pattern is used as a mask to form the cylinder hole by anisotropic etching.

Forming of the cylinder hole by anisotropic etching is stopped when an edge of the cylinder hole reaches the previously formed silicon nitride film 16.

With this process, the bottoms of cylinder holes formed in the memory array areas 200 can be aligned at a predetermined position.

This is followed by eliminating the silicon nitride film 16 at the bottom of the cylinder hole. Then, CVD, MOCVD or the like is adopted to form a lower electrode 18 of titanium nitride or the like, a capacitor film 19 of silicon oxide, aluminum oxide, hafnium oxide or the like and an upper electrode 20 of titanium nitride or the like.

Here, it is preferable that a silicide layer of titanium silicide or the like is formed at the bottom of the cylinder hole after elimination of the silicon nitride film 16.

Further, formed on the upper electrode 20 is an interlayer insulating layer 32 of silicon oxide or the like to form a conducting circuit for the upper electrode 20, and thereby, forming of the memory array area 200 illustrated in FIG. 11 can be completed.

Figure 12:
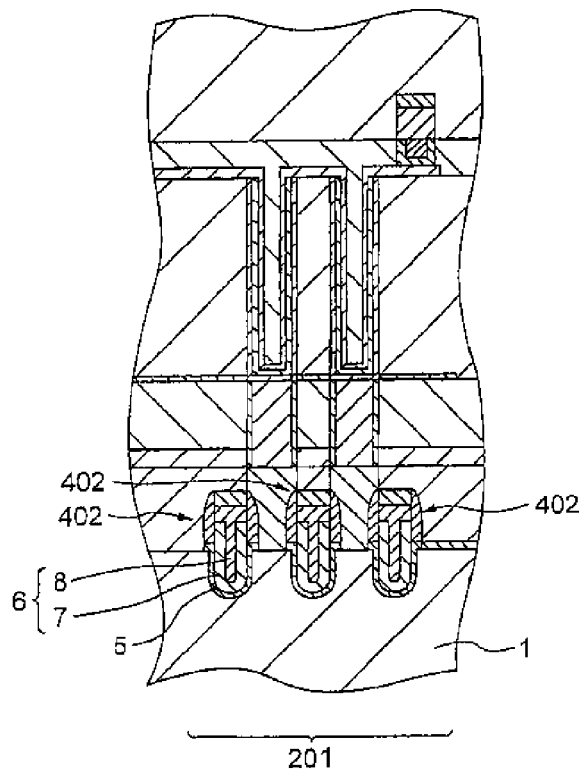
FIG. 12 is a substantial-part cross sectional view illustrating a step of forming a capacitor in the memory array area where the insulating film gate type electric field effect transistors each having recess gate structure are formed.

FIG. 12 is a substantial-part cross sectional view illustrating a step of forming a capacitor in the memory array area 201 where the insulating film gate type electric field effect transistors 402 each having recess gate structure are formed.

In the case of the insulating film gate type electric field effect transistor 400 illustrated in FIG. 11, the gate electrode 6 corresponding to the source and drain regions (not shown) is formed in the semiconductor substrate 1 via the gate oxide film 5 of silicon oxide or the like. This gate electrode 6 has polysilicon 7 containing an N-type impurity of phosphorus or the like and a P-type impurity of boron or the like, a conductive layer S of tungsten, tungsten silicide or the like, an insulating film and side walls 9 of silicon nitride film or the like.

On the other hand, in the insulating film gate type electric field effect transistor 402 having a recess gate structure illustrated in FIG. 12, the gate electrode 6 corresponding to the source and drain regions (not shown) is formed in the semiconductor substrate 1 via the gate oxide film 5 of silicon oxide or the like.

This gate electrode 6 has polysilicon 7 containing an N-type impurity of phosphorus or the like and a P-type impurity of boron or the like, a conductive layer 8 of tungsten, tungsten silicide or the like and so on, and each of the gate oxide film 5 and the polysilicon 7 has U-shaped cross section and the conductive layer 8 has a T-shaped cross section.

Even when an insulating film gate type electric field effect transistor in the memory array area 200 is an insulating film gate type electric field effect transistor 402 having a recess gate structure illustrated in FIG. 12 as described above, the memory array area 201 illustrated in FIG. 12 can be formed by the same process described in the case of FIG. 7.

Some or all of insulating film gate type electric field effect transistors included in each memory array areas 200 utilized in the present invention, or preferably all of insulating film gate type electric field effect transistors in each memory array areas 200 are transistors each having a recess gate structure, percentage of the dangling bond that exists at the boundary between the gate oxide film 5 and the semiconductor substrate 1 where the insulating film gate type electric field effect transistors are formed is relatively increased, which preferably ensures effectiveness of the manufacturing method of the present invention.

Next description is made about a step of forming of the peripheral circuit area 300.

Figure 13:
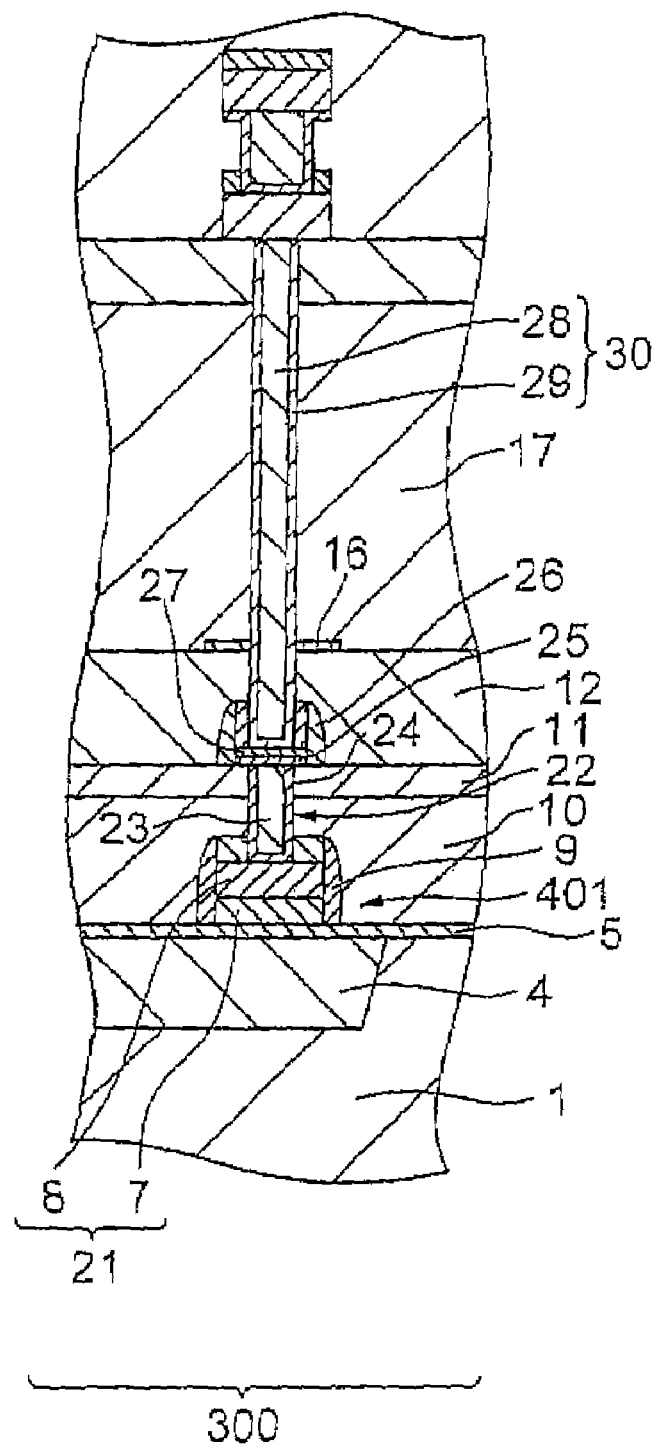
FIG. 13 is a substantial-part cross sectional view for explaining a step of forming a conducting circuit in the peripheral circuit area of the substrate-to-be-processed.

FIG. 13 is a substantial-part cross sectional view for explaining a step of forming a conducting circuit in the peripheral circuit area 300 of the substrate-to-be-processed.

As illustrated in FIG. 13, formed on the interlayer insulating film 12 and the silicon nitride film 16 is an interlayer insulating film 17 of BPSG (boron phosphorous silicate glass) by thermal CVD using TEOS (tetraetoxysilane), silicon oxide by plasma method or the like.

Next, formed on the interlayer insulating film 17 is a photoresist layer, and then, a resist pattern (not shown) is formed on interlayer insulating film 17 by well-known lithography so as to form through holes.

This resist pattern is used as a mask to perform anisotropic etching so as to form the through holes reaching the bit lines 25.

Then, CVD, MOCVD or the like is adopted to form a lower electrode 27 of titanium nitride or the like and a contact plug 30 having side walls 29 of titanium nitride or the like and tungsten 28.

Further, an interlayer insulating film of silicon oxide or the like is formed to form a conducting circuit for the contact plug 30. Thereby, formation of the peripheral circuit area 300 illustrated in FIG. 13 is completed.

Next description is made about a relationship between the memory array area and the peripheral circuit area used in the present invention.

FIG. 1 is a schematic plan view for explaining the relationship between the memory array area and the peripheral circuit area contained in a DRAM, and illustrates one DRAM chip as a whole.

As described previously with reference to FIG. 3 and the like, the memory array area 200 is formed in the semiconductor substrate 1 and has an assembly of memory cells including insulating film gate type electric field effect transistors 400, cell contacts 2 and capacitors 3.

In general, the number of memory cells contained in the memory array area 200 is several ten hundreds to several millions.

In the semiconductor substrate illustrated in FIG. 1, two or more box-shaped memory array areas 200 as a whole consist in one box-shaped memory block area 210.

In addition, two or more box-shaped memory block areas 210 are arranged at given intervals, which as a whole consist in one box-shaped memory chip area 220 in the semiconductor substrate 1.

Here, there is no limitation on the box shape, and the box shape includes a square, a rectangle, a parallelogram, a trapezoid, and so on. However, the shape is usually, a square or a rectangle.

Figure 14:
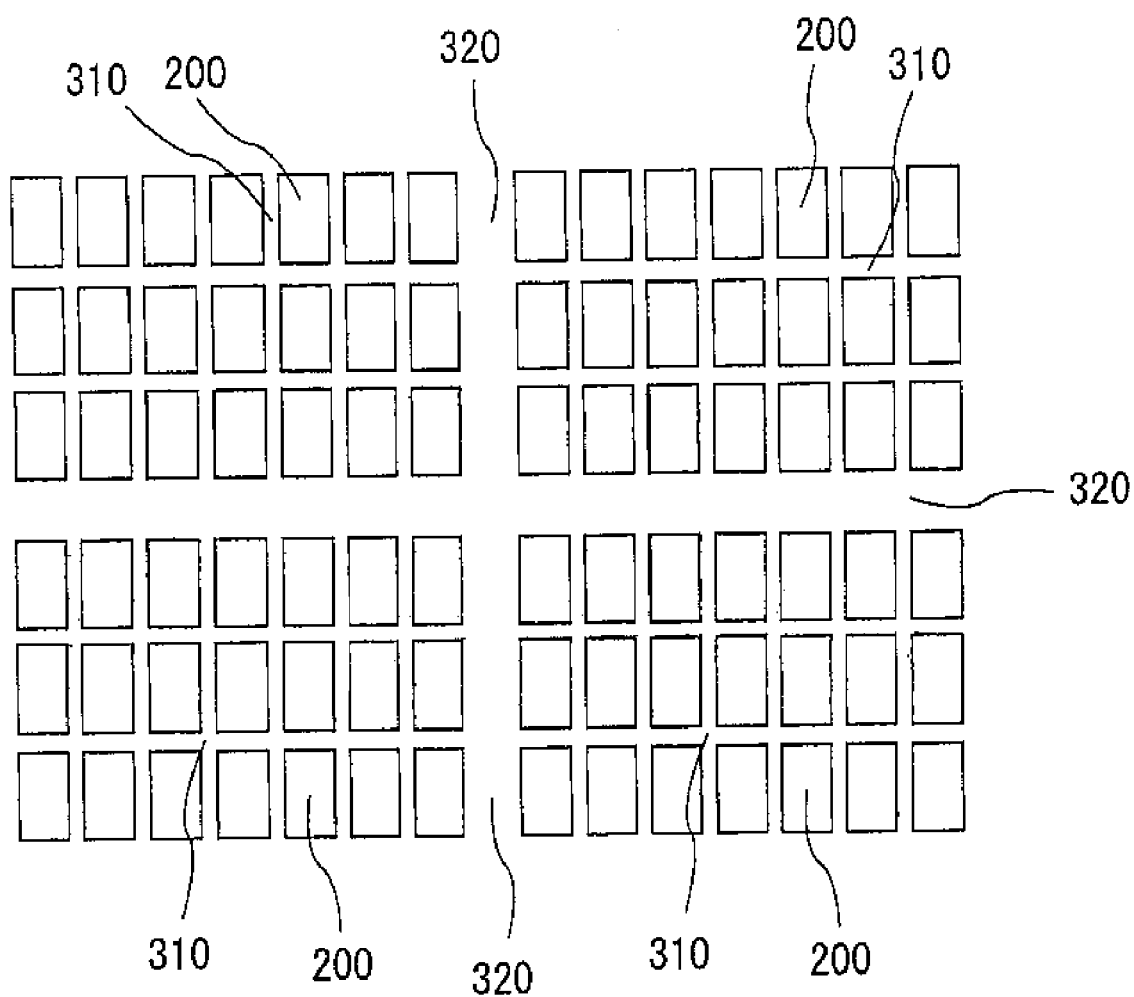
FIG. 14 is an enlarged plan view of a part of the DRAM chip of FIG. 1.

FIG. 14 is a substantial-part plan view illustrating a part of the DRAM chip in FIG. 1 enlarged.

As illustrated in FIG. 14, narrow paths 310 are arranged along the four sides of each of the memory array areas 200. Likewise, arranged along the four sides of each of the memory block areas 210, which is an assembly of the memory array areas 200, are wide paths 320.

Formed at the lower sides of the narrow paths 310 and the wide paths 320 are the above-described peripheral circuit areas 300.

FIG. 14 illustrates the semiconductor substrate 1 seen from the upper side in the direction of the normal to its surface, however, the above-described FIG. 4 illustrates the cross section of the semiconductor substrate 1 cut vertically relative to the surface of the semiconductor.

The above-described silicon nitride film 16 shown in FIG. 4 is eliminated only at the lower side of the wide paths illustrated in FIG. 14 while the silicon nitride film 16 at the lower side of the narrow paths 310 are not eliminated and the substrate-to-be-processed is subjected to processing at an environment of hydrogen gas. A DRAM obtained through this process does not exhibit improved defect rate as compared with the case where the silicon nitride film 16 is not eliminated at all.

On the other hand, the aforementioned silicon nitride film 16 illustrated in FIG. 4 is eliminated at the lower side of the wide paths 3 and the narrow paths 310 and then, the substrate-to-be-processed is subjected to processing at an environment of a hydrogen gas. A DRAM obtained through this process exhibits significantly improved defect rate as compared with the case where the silicon nitride film 16 is not eliminated at all.

Each memory array area is usually of from 80 to 120 μm in length in the direction of the surface of the semiconductor substrate 1 and of from 210 to 260 μm in width.

Each narrow path 310 is usually of from 10 to 30 μm in width.

In view of these, the silicon nitride film 16 illustrated in FIG. 4 is preferably eliminated in the direction parallel to the semiconductor substrate 1, checkered longitudinally and horizontally, of from 10 to 30 μm in width and from 10 to 60 μm away from another part of the silicon nitride film.

In addition, the silicon nitride film 16 illustrated in FIG. 4 is preferably eliminated at 5 to 90% of its total surface area, preferably 10 to 50% and more preferably 15 to 40%.

As the DRAM obtained by the manufacturing method of the present invention presents a low defect rate even with a larger packing density, it can be advantageously used in electronic devices including computers, portable phones, game machines, communication devices, and various home electric devices.

Next, the present invention is described by way of example, however, the example is not for limiting the present invention.

Embodiment

The silicon nitride film 16 shown in FIG. 4 was eliminated completely in the peripheral circuit area 300 including the narrow paths 310 and wide paths 320 in FIG. 14. This corresponds to a substrate-to-be-processed 500 obtained through the process of FIG. 6 describing the second embodiment.

Elimination of the silicon nitride film 16 was performed at a temperature of 60° C., at a pressure of 200 mTorr and by performing reactive ion etching at a frequency of 600 W while Ar of 400 ml/min, $CF_4$ of 50 ml/min, $CH_3F$ of 20 ml/min and $O_2$ of 10 ml/min were made to flow therethrough.

The thus obtained substrate-to-be-processed 500 was fixed to a fixing jig.

Then, the substrate-to-be-processed 500 set on the fixing holder was transported inside the apparatus for hydrogen treatment.

The apparatus was filled with nitrogen to confirm that the concentration of residual oxygen was lowered sufficiently and check the temperature inside the apparatus by a temperature measurement device.

Then, a mixed gas of hydrogen and nitrogen at a ratio of 5:2 was introduced into the apparatus and the substrate-to-be-processed was processed in the atmosphere of the mixed gas at temperatures of 280 to 430° C. and for five hours. Then, the same steps described with reference to FIGS. 11 and 13 were performed to obtain a DRAM.

The obtained DRAM was subjected to reliability test.

The reliability test used is a SHT (static-hold-test).

First, the DRAM was set at a temperature of 88° C. and placed in an environment where an external power supply voltage is 2.0 V/1.6 V. Then, data was written in a memory cells the operation of the memory cell was stopped for a given time and data remaining in the memory cell was read out.

This time (duration) was adjusted in the range of from 160 ms to 500 ms to repeat experiments to measure data retention rate of each memory cell.

For example, when SHT time is 300 ms and SHT yield rate is 90%, this means that 90% of the memory cells meat data retention time of 300 ms.

The results are shown in FIGS. 15 to 19.

Figure 15:
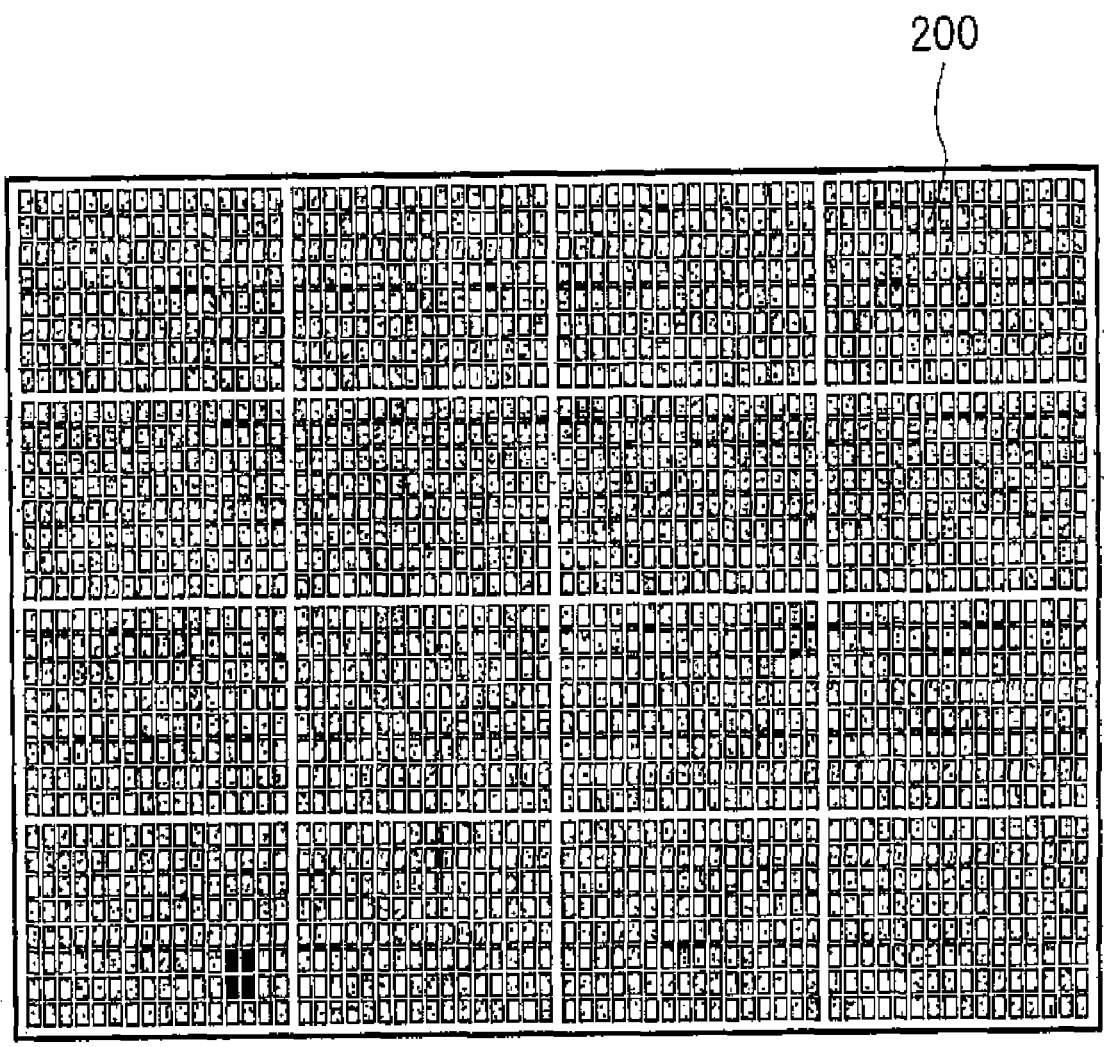
FIG. 15 is a plan view schematically illustrating a DRAM chip (Embodiment)

FIG. 15 is a schematic plan view of a DRAM chip. In the memory array areas, a memory cell having a defect is represented by a dot. Each dot corresponds to a memory cell having a defect.

Figure 16:
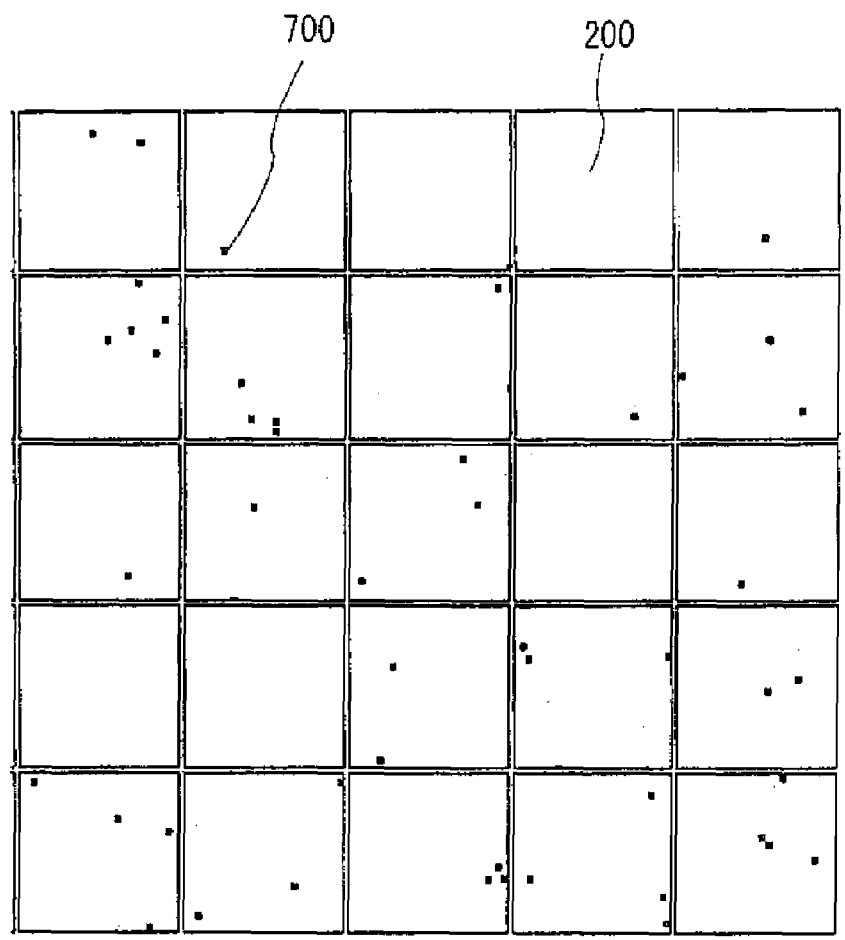
FIG. 16 is an enlarged plan view of a DRAM chip (Example)
Figure 17:
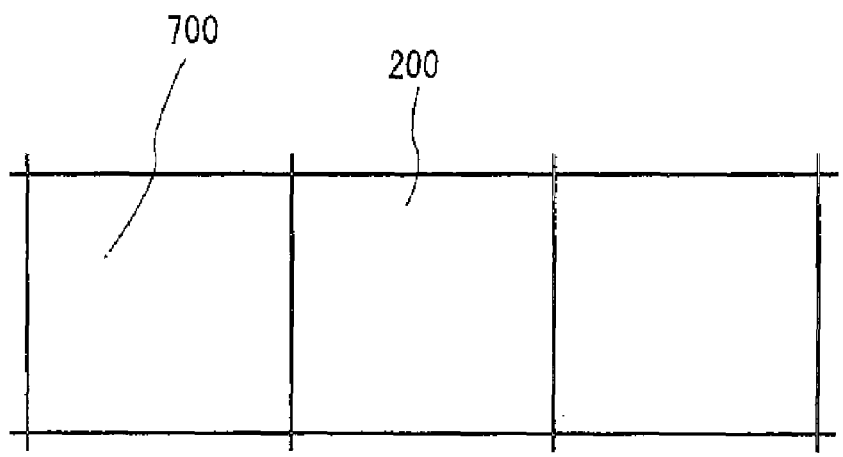
FIG. 17 is a further enlarged plan view of a DRAM chip (Embodiment)

FIGS. 16 and 17 are enlarged view of FIG. 15. The reference numeral 700 denotes a memory cell having a defect.

Figure 18:
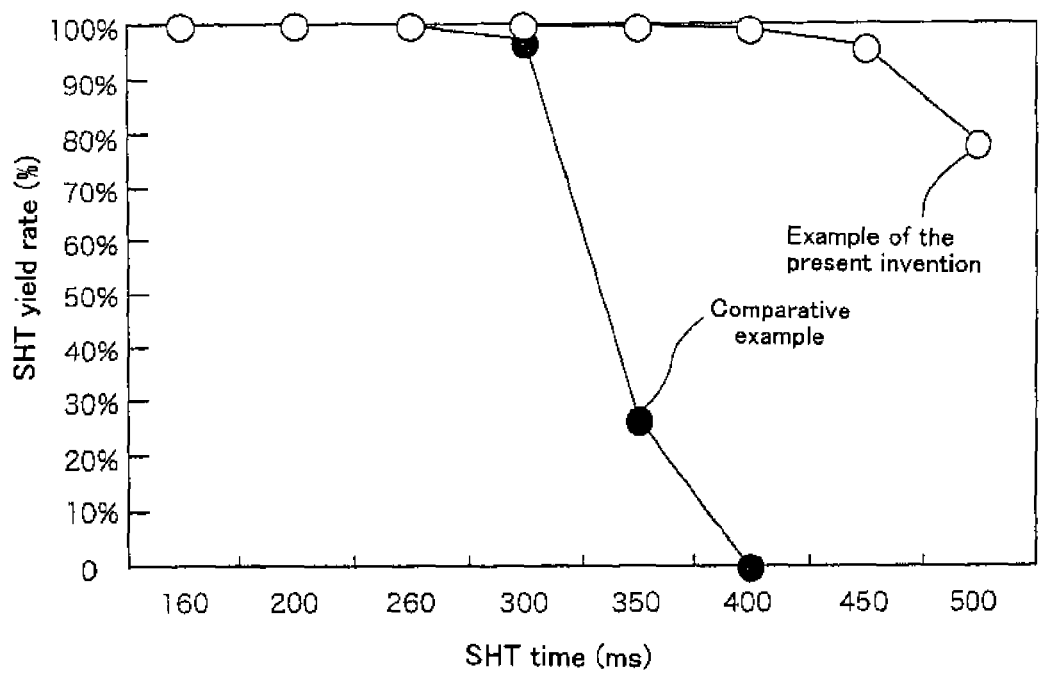
FIG. 18 shows a yield rate (percentage of memory cells under normal operation) obtained after the processing in an atmosphere of hydrogen gas is performed once.

FIG. 18 shows a yield rate (percentage of memory cells under normal operation) obtained when the processing in an atmosphere of hydrogen gas is performed once.

Figure 19:
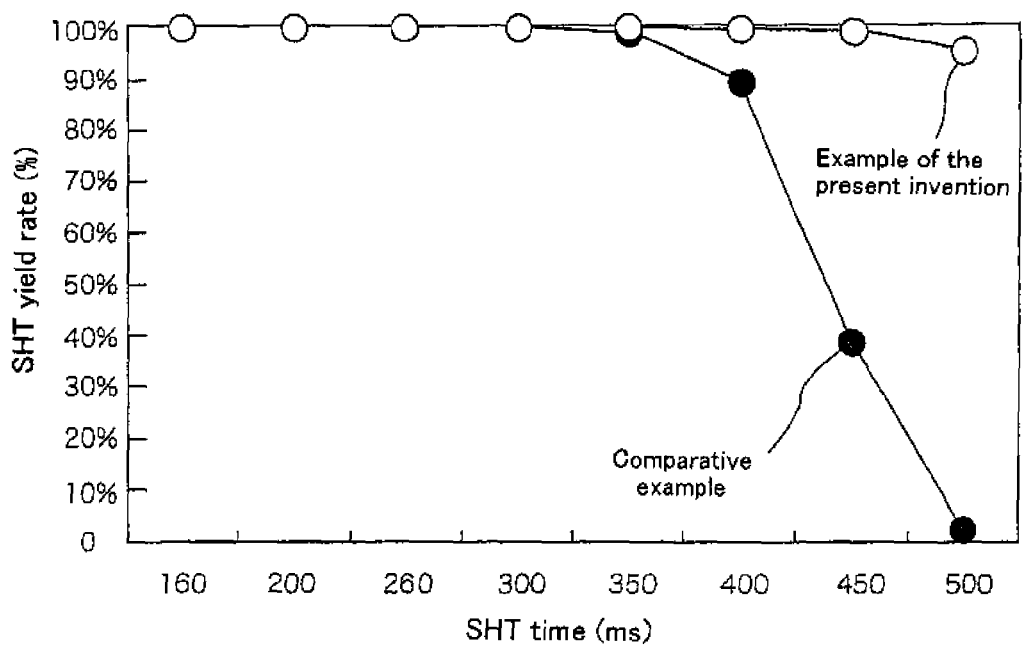
FIG. 19 shows a yield rate (percentage of memory cells under normal operation) obtained after the processing in an atmosphere of hydrogen gas is performed twice.

FIG. 19 shows a yield rate (percentage of memory cells under normal operation) obtained when the processing in an atmosphere of hydrogen gas is performed twice.

COMPARATIVE EXAMPLE

Except that the silicon nitride film 16 shown in FIG. 4 was not eliminated at all, the same experiment was performed.

Results are shown in FIGS. 18 to 22.

Figure 20:
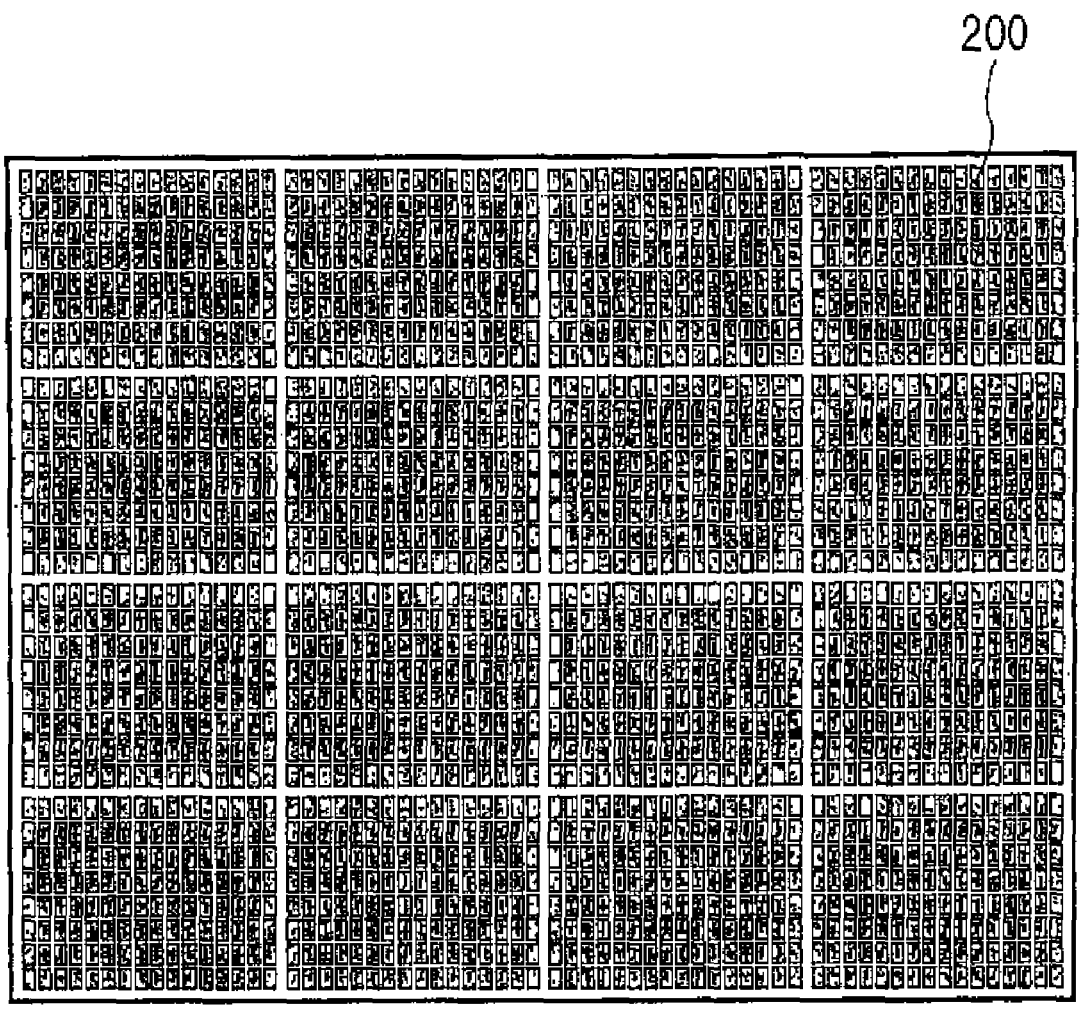
FIG. 20 is a plan view schematically illustrating a DRAM chip (Comparative example)
Figure 21:
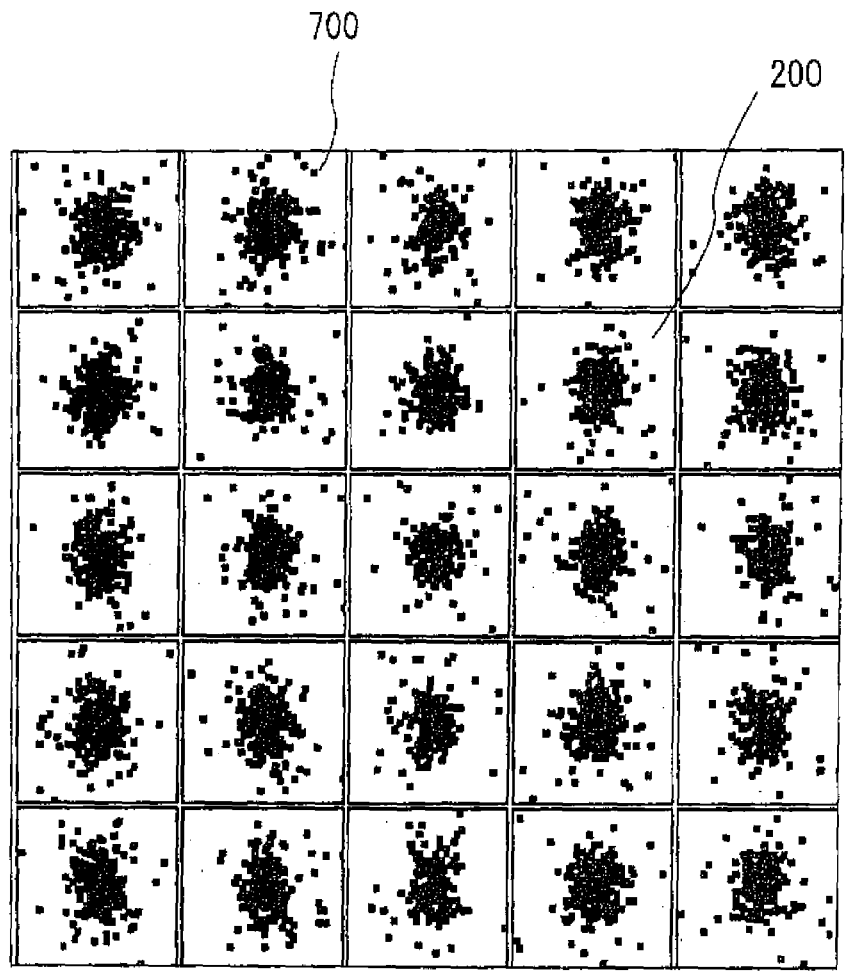
FIG. 21 is an enlarged plan view of a DRAM chip (Comparative example)
Figure 22:
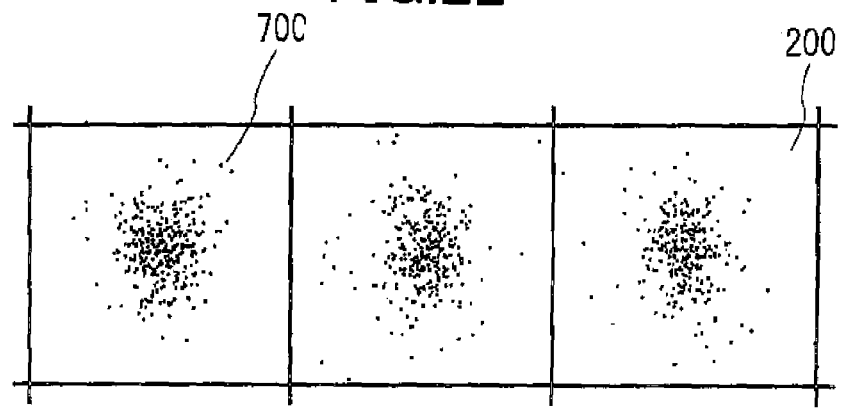
FIG. 22 is a further enlarged plan view of a DRAM chip (Comparative example).

FIG. 20 is a schematic plan view of a DRAM chip. In the memory array areas 200, each memory cell where defect occurs is indicated by a dot. One dot represents one memory cell having a defect. FIGS. 21 and 22 are enlarged views of FIG. 20. The reference numeral 700 indicates a memory cell having a defect.

As is clear from comparison between the example and comparative example, the DRAM manufacturing method of the present invention enables defects of the DRAM to be reduced drastically.

In addition, it is possible to improve SHT by 100 to 150 ms.

A DRAM or an embedded DRAM device obtained by the manufacturing method of the present invention exhibits a small defect rate even with a larger packing density and ensures high reliability. Therefore, such a DRAM is usable effectively particularly in various electronic devices such as electronic devices for domestic use including electrical domestic appliances, industrial electronic devices including computers and so on.

The present invention is not limited to the above described embodiments, and various variations and modifications maybe possible without departing from the scope of the present invention.

This application is based on the Japanese Patent application No. 2006-287177 filed on Oct. 23, 2006, entire content of which is expressly incorporated by reference herein.

What is claimed is:

1. A method for manufacturing a dynamic random access memory having a memory cell array area and a peripheral circuit area arranged along the circumference of the memory cell array area, the method comprising at least:

a step (1) of forming a plurality of first field effect transistors in the memory cell array area and a plurality of second field effect transistors in the peripheral circuit area;

a step (2) of forming a first interlayer insulating layer on a whole surface so as to cover said plurality of the first field effect transistors and said plurality of the second field effect transistors, and flattening the surface of the first interlayer insulating layer;

a step (3) of forming a plurality of cell contacts in the first interlayer insulating layer, each of the cell contacts being electrically connected to an associated one of the first field effect transistors;

a step (4) of forming a second interlayer insulating layer on the plurality of the cell contacts and the first interlayer insulating layer;

a step (5) of forming a plurality of bit contacts penetrating through the second interlayer insulating layer and the first interlayer insulating layer in the peripheral circuit area, each of the bit contacts being electrically connected to an associated gate electrode of each of the second field effect transistors;

a step (6) of forming bit lines on the bit contacts;

a step (7) of forming a third interlayer insulating layer on whole surfaces so as to cover the bit lines, and flattening the surface of the third interlayer insulating layer;

a step (8) of forming a plurality of capacity contacts penetrating through the third interlayer insulating layer and the second interlayer insulating layer in the memory cell array area, each of the capacity contacts being electrically connected to each of the cell contacts;

a step (9) of forming a silicon nitride film on the plurality of the capacity contacts and the third interlayer insulating layer;

a step (10) of eliminating 5 to 90% of the silicon nitride film in the whole surfaces, except for a part of the memory cell array area and a part of the peripheral circuit area where a through hole will be formed;

a step (11) of forming a forth interlayer insulating layer on whole surfaces so as to cover the silicon nitride film and areas where the silicon nitride film has been eliminated;

a step (12) of forming a plurality of cylinder holes penetrating through the forth interlayer insulating layer so as to expose the silicon nitride film on the plurality of the capacity contacts;

a step (13) of exposing the surfaces of the plurality of the capacity contacts by eliminating the silicon nitride film exposing at the bottoms of the cylinder holes;

a step (14) of forming a plurality of capacitors in the cylinder holes, each of capacitors including a lower electrode electrically connected to an associated one of the capacity contacts, a dielectric film formed on the lower electrode and an upper electrode formed on the dielectric film;

a step (15) of forming a fifth interlayer insulating layer on the plurality of the capacitors and the forth interlayer insulating layer;

a step (16) of forming the through holes connected to the bit lines, which penetrate through the fifth interlayer insulating layer, the forth interlayer insulating layer, the silicon nitride film and the third interlayer insulating layer; and a step (17) of processing the substrate in an atmosphere containing a hydrogen gas after the step (10).

2. The method of claim 1, wherein in the step (10), 10 to 50% of the silicon nitride film in the whole surfaces are eliminated.

3. The method of claim 1, wherein in the step (10), 15 to 40% of the silicon nitride film in the whole surfaces are eliminated.

4. A method for manufacturing a dynamic random access memory having a memory cell array area and a peripheral circuit area arranged along the circumference of the memory cell array area, the method comprising at least:

a step (1) of forming a plurality of first field effect transistors in the memory cell array area and a plurality of second field effect transistors in the peripheral circuit area;

a step (2) of forming a first interlayer insulating layer on a whole surface so as to cover said plurality of the first field effect transistors and said plurality of the second field effect transistors, and flattening the surface of the first interlayer insulating layer;

a step (3) of forming a plurality of cell contacts in the first interlayer insulating layer, each of the cell contacts being electrically connected to an associated one of the first field effect transistors;

a step (4) of forming a second interlayer insulating layer on the plurality of the cell contacts and the first interlayer insulating layer;

a step (5) of forming a plurality of bit contacts penetrating through the second interlayer insulating layer and the first interlayer insulating layer in the peripheral circuit area, each of the bit contacts being electrically connected to an associated gate electrode of each of the second field effect transistors;

a step (6) of forming bit lines on the bit contacts;

a step (7) of forming a third interlayer insulating layer on whole surfaces so as to cover the bit lines, and flattening the surface of the third interlayer insulating layer;

a step (8) of forming a plurality of capacity contacts penetrating through the third interlayer insulating layer and the second interlayer insulating layer in the memory cell array area, each of the capacity contacts being electrically connected to each of the cell contacts;

a step (9) of forming a silicon nitride film on the plurality of the capacity contacts and the third interlayer insulating layer;

a step (10) of eliminating 5 to 90% of the silicon nitride film in the whole surfaces, except for a part of the memory cell array area and a part of the peripheral circuit area where a through hole will be formed;

a step (11) of forming a forth interlayer insulating layer on whole surfaces so as to cover the silicon nitride film and areas where the silicon nitride film has been eliminated;

a step (12) of forming a plurality of cylinder holes penetrating through the forth interlayer insulating layer so as to expose the silicon nitride film on the plurality of the capacity contacts;

a step (13) of exposing the surfaces of the plurality of the capacity contacts by eliminating the silicon nitride film exposing at the bottoms of the cylinder holes;

a step (14) of forming a plurality of capacitors in the cylinder holes, each of capacitors including a lower electrode electrically connected to an associated one of the capacity contacts, a dielectric film formed on the lower electrode and an upper electrode formed on the dielectric film;

a step (15) of forming a fifth interlayer insulating layer on the plurality of capacitors and the forth interlayer insulating layer;

a step (16) of forming the through holes connected to the bit lines, which penetrate through the fifth interlayer insulating layer, the forth interlayer insulating layer, the silicon nitride film and the third interlayer insulating layer; and a step (17) of processing the substrate in an atmosphere containing a hydrogen gas after the step (10), wherein the step (17) is performed at a temperature in a range of from 380 to 470° C., and for a time duration of from one-half hour to twelve hours.

5. The method of claim 4, further comprising:
a step (18) of lowering the temperature to 300° C. or less after the step (17).

6. The method of claim 1, wherein forming the silicon nitride film of the step (9) is performed at a temperature in the range of from 600 to 650° C.

7. The method of claim 1, wherein in the step (9), a forming thickness of silicon nitride film is in the range of from 30 to 70 nm.

8. The method of claim 1, wherein in the step (9), a forming thickness of silicon nitride film is in the range of from 40 to 60 nm.

9. The method of claim 4, wherein in the step (10), 10 to 50% of the silicon nitride film in the whole surfaces are eliminated.

10. The method of claim 4, wherein in the step (10), 15 to 40% of the silicon nitride film in the whole surfaces are eliminated.

* * * * *